(12) United States Patent
Gzovskyy et al.

(10) Patent No.: US 10,610,924 B2
(45) Date of Patent: Apr. 7, 2020

(54) METHOD AND DEVICE FOR PRODUCING A MONOTECTIC ALLOY

(71) Applicant: ZOLLERN BHW GLEITLAGER GMBH & CO. KG, Braunschweig (DE)

(72) Inventors: Kostyantyn Gzovskyy, Braunschweig (DE); Edgar Gust, Wolfenbüttel (DE)

(73) Assignee: Zollern BHW Gleitlager GmbH & Co. KG, Braunschweig (DE)

( * ) Notice: Subject to any disclaimer, the term of this patent is extended or adjusted under 35 U.S.C. 154(b) by 86 days.

(21) Appl. No.: 15/740,143

(22) PCT Filed: Jul. 27, 2016

(86) PCT No.: PCT/DE2016/100343
§ 371 (c)(1),
(2) Date: Dec. 27, 2017

(87) PCT Pub. No.: WO2017/016551
PCT Pub. Date: Feb. 2, 2017

(65) Prior Publication Data
US 2018/0185906 A1    Jul. 5, 2018

(30) Foreign Application Priority Data

Jul. 30, 2015   (DE) .................. 10 2015 112 550

(51) Int. Cl.
*B22D 11/00* (2006.01)
*B22D 11/06* (2006.01)
(Continued)

(52) U.S. Cl.
CPC ........ *B22D 11/003* (2013.01); *B22D 11/0611* (2013.01); *B22D 11/0682* (2013.01);
(Continued)

(58) Field of Classification Search
CPC ..... C30B 29/60; C30B 11/001; C30B 15/007; C30B 15/002; C30B 29/64;
(Continued)

(56) References Cited

U.S. PATENT DOCUMENTS 3,416,594 A * 12/1968 Gyongyos ............ B22D 11/066
164/433
3,623,535 A * 11/1971 Lenaeus ............ B22D 11/0602
164/482
(Continued)

FOREIGN PATENT DOCUMENTS

CN   101791684 A   8/2010
CN   102407301 A   4/2012
(Continued)

*Primary Examiner* — Matthew J Song
(74) *Attorney, Agent, or Firm* — W & C IP

(57) ABSTRACT

The invention relates to a method for producing a strand from a monotectic alloy which is made of multiple constituents and in which drops of a primary phase are distributed in a uniform manner in a crystalline matrix in the solidified state. The uniform distribution can be achieved during the production process using the following method steps: a) melting the alloy constituents which consist of at least one matrix component and components that form the primary phase and heating the constituents to a temperature at which a single homogeneous phase exists; b) transporting the melt (2) in the form of strands in a transport direction which is inclined towards the horizontal at a transport speed; c) cooling the melt (2) while transporting the strand lower face perpendicularly to the transport direction in order to form a crystallization front when transporting in a cooling zone; d) setting the cooling intensity, the inclination of the transport direction, and the transport speed such that a horizontal crystallization front is formed and the Marangoni force produced by cooling and forming the primary phase in the form of drops is oriented anti-parallel to the gravitational (Continued)

force such that the drops of the primary phase in the matrix component move in the direction of the gravitational force; and e) drawing the alloy which has been solidified into the strand (9) out of the cooling zone.

9 Claims, 9 Drawing Sheets

(51) Int. Cl.
  *C30B 11/00* (2006.01)
  *C30B 15/00* (2006.01)
  *C30B 29/60* (2006.01)
  *C22C 21/00* (2006.01)

(52) U.S. Cl.
  CPC .......... *C30B 11/001* (2013.01); *C30B 15/002* (2013.01); *C30B 15/007* (2013.01); *C30B 29/60* (2013.01); *C22C 21/003* (2013.01)

(58) Field of Classification Search
  CPC .............. B22D 11/0611; B22D 11/005; B22D 11/0602; B22D 11/0614; B22D 11/064; B22D 11/0651
  See application file for complete search history.

(56) References Cited

U.S. PATENT DOCUMENTS

| | | | |
|---|---|---|---|
| 4,996,025 A | | 2/1991 | Pratt et al. |
| 5,226,953 A | | 7/1993 | Hodes et al. |
| 5,286,445 A | * | 2/1994 | Kamiya .................... C22F 1/04 420/530 |
| 6,198,232 B1 | * | 3/2001 | Marinus ............. H05B 41/2821 315/209 R |
| 6,273,970 B1 | * | 8/2001 | Kopeliovich ......... B22D 11/115 148/437 |
| 2010/0221141 A1 | | 9/2010 | Tonn et al. |
| 2011/0111301 A1 | | 5/2011 | Rossi |

FOREIGN PATENT DOCUMENTS

| | | |
|---|---|---|
| DE | 15 08 961 A1 | 11/1969 |
| DE | 19 03 428 A1 | 8/1970 |
| DE | 20 65 613 A1 | 2/1975 |
| DE | 29 03 975 A1 | 8/1980 |
| DE | 40 03018 A1 | 2/1990 |
| DE | 40 14 430 A1 | 5/1990 |
| EP | 0 190 691 A1 | 8/1986 |
| EP | 0 497 944 A1 | 1/1997 |
| EP | 0 940 474 A1 | 9/1999 |
| GB | 1 067 114 | 5/1967 |
| GB | 1 252 211 | 11/1971 |

* cited by examiner

METHOD AND DEVICE FOR PRODUCING A MONOTECTIC ALLOY

The invention relates to a method for producing a strand from a monotectic alloy which is formed from a plurality of constituents and in which droplets of a primary phase are uniformly distributed in a crystalline matrix in the solidified state.

The invention furthermore relates to a device for producing a strand from a monotectic alloy which is formed from a plurality of constituents and in which droplets of a primary phase are uniformly distributed in a crystalline matrix in the solidified state.

In particular, the invention relates to a monotectic aluminum-bismuth alloy, in particular as a plain bearing alloy.

Highly stressed plain bearings are constructed from a plurality of layers in order to satisfy the large number of to some extent contradictory demands made on the bearings. Such plain bearings are often constructed using steel-aluminum composites.

While a steel backing shell enables the mechanical loads to be absorbed and ensures a tight fit, plain bearing materials must withstand the many and various tribological stresses and be fatigue resistant. To satisfy these requirements, the plain bearing materials contain a crystal matrix, consisting of aluminum for example, into which hard phases, such as silicon and intermetallic precipitates, and, on the other hand, soft phases, e.g. lead or tin, can be incorporated. Heavy duty multi-layer plain bearings often additionally have an antifriction layer applied by electrodeposition to the functional layer formed by the plain bearing material.

This soft antifriction layer ensures that the bearing has good antiseizure properties and can embed abraded particles and thus keep them away from the sliding surface.

Environmental aspects are playing an increasing role for plain bearing alloys. As an environmentally friendly alternative to lead-containing aluminum plain bearing alloys, consideration has been given to plain bearings based on aluminum-tin, these being used without an additional antifriction layer. However, there are limits to the mechanical properties of these alloys, e.g. fatigue resistance and heat resistance. During casting, the relatively high tin content leads to the formation of a coherent tin lattice at the grain boundaries, which significantly impairs the load bearing capacity of these alloys, especially at relatively high temperatures.

It is known that bismuth offers advantages over tin as a soft phase in the aluminum matrix. Bismuth has a higher melting point than tin and can therefore be used at higher temperatures. By means of special casting and heat treatment measures, it is possible to avoid a massive enrichment of the bismuth at the grain boundaries of the plain bearing alloy and to obtain sufficiently uniform and fine distribution of the bismuth droplets in the microstructure. The aluminum-bismuth alloy forms a monotectic microstructure, in which fine and uniform distribution of the bismuth droplets leads to an improvement in load bearing capacity and in tribological properties over aluminum-tin alloys.

DE 40 03 018 A1 describes an aluminum alloy which can optionally contain lead, bismuth or indium or a combination thereof as the main alloying elements. Moreover, it is additionally intended to contain one or more components which can be provided in considerable proportions of up to 20% by weight, e.g. silicon, tin, zinc, magnesium and copper. Here, the essential concept is to cast the alloy continuously and vertically to form a strip or wire and to provide a high cooling rate of 300 to 1500 K/s. The high cooling rate is intended to prevent the formation of large-volume precipitates of a minority phase in the time between the undershooting of the segregation temperature and the complete solidification of the matrix metal. However, it is a matter of general knowledge from practical experience with the continuous casting of aluminum alloys that there is a considerable risk of cracking due to the very high cooling rates and that the process stability required for series manufacture can be ensured only with great difficulty. In the single illustrative embodiment disclosed, the aluminum alloy melt contains 5% bismuth and 5% silicon. The high silicon content leads to reinforcement of the aluminum matrix but has a negative effect on the size of the primary bismuth phase. Large droplets of the bismuth phase are deformed by subsequent rolling processes into very thick strands which considerably diminish the mechanical load bearing capacity and tribological properties of the material.

EP 0 940 474 A1 discloses a monotectic aluminum plain bearing alloy with a bismuth content of 5 to 15% by weight and at least one main alloying element from the group comprising silicon, tin and lead, totaling up to 15% by weight. The single illustrative embodiment is composed of 8% by weight of bismuth, 1% by weight of tin and 4% by weight of silicon as well as 0.3% by weight of manganese as a secondary alloying element, with the rest being aluminum. For the envisaged strip casting of this alloy, homogeneous distribution of the bismuth phase by intensive agitation of the melt in an electromagnetic field is the aim. Refinement of the microstructure is said to be possible by the addition of grain refiners that are not defined specifically. The disadvantages mentioned above are associated with the main alloying elements, tin and silicon, as the soft and hard components, respectively.

The situation is similar for the alloy known from EP 0 190 691 A1, which contains 4 to 7% by weight of bismuth, 1 to 4.5% by weight of silicon and at least one element from the group comprising tin, zinc and antimony accounting for up to 5% by weight, as well as optional further additional alloying elements. The hardening of the aluminum matrix caused by the silicon content brings about an enlargement of the droplets of the primary phase, giving rise to the disadvantages mentioned during the subsequent rolling.

DE 40 14 430 A1 discloses the practice of subjecting a monotectic aluminum-silicon-bismuth alloy to heat treatment at temperatures of 575° C. to 585° C. in order to achieve fine distribution of the bismuth phase, which is in the form of extended platelets after rolling. The heat treatment furthermore offers the possibility of improving the strength values of the aluminum plain bearing alloy by means of hardening effects. The elements suitable for achieving the possible hardening effects are silicon, magnesium, zinc and zirconium, for example. The addition of copper increases the hardening rate and can be used in combination with these elements.

U.S. Pat. No. 5,286,445 discloses an aluminum plain bearing alloy with a bismuth content of 2 to 15% by weight, 0.05 to 1% by weight of zirconium and a copper content and/or magnesium content of up to 1.5% by weight. In addition, this alloy contains at least one element from the group comprising tin, lead and indium totaling 0.05 to 2% by weight or at least one element from the group comprising silicon, manganese, vanadium, antimony, niobium, molybdenum, cobalt, iron, titanium and chromium totaling 0.05 to 5% by weight. The additions of tin, lead and indium support the recoagulation of extended bismuth droplets to finer precipitates at temperatures of 200° C. to 350° C. The elements zirconium, silicon and magnesium bring about the actual hardening effect after annealing in a temperature range of 480° C. to 525° C., which is carried out shortly before the roll bonding process. The transition elements are intended to ensure an additional increase in the mechanical load bearing capacity of the material.

The disadvantageous effect of silicon also occurs here. The addition of magnesium additionally entails the disadvantage that magnesium forms the intermetallic compound Mg3Bi2 with bismuth. This is incorporated into the bismuth droplets and significantly reduces the embedding capacity of the bismuth droplets for abraded particles. The addition of tin considerably impairs the mechanical load bearing capacity of the plain bearing material at relatively high temperatures.

None of the bismuth-containing alloys described above have achieved any practical significance since the complex processes which take place during production by continuous casting and subsequent further processing to form a plain bearing shell have as yet not been sufficiently mastered. In addition to the fine distribution of the primary phase in the cast condition, the possibility of being able to produce fine distribution of the primary phase even after the required forming and roll bonding processes must be regarded as a particular precondition for an optimum property profile of the aluminum plain bearing alloy. Further requirements are high strength, mechanical load bearing capacity, even at high temperatures, wear resistance of the aluminum matrix and good formability.

US 2010/0221141 discloses a silicon-free alloy containing the main alloying elements of bismuth, copper and zinc. Although the high zinc content leads to coarsening of the primary bismuth phase, it brings about a significant reduction in bismuth inclusions after rolling and heat treatment. This phenomenon may be explained by the high diffusion mobility of the zinc in the aluminum matrix and the associated lowering of the recrystallization temperature. The formation of new small grains as a substitute for the deformed grains leads to a reduction in the size of the bismuth particles. However, the high mobility of the zinc in the aluminum matrix causes premature softening and an accumulation of zinc at the grain boundaries. This results in local embrittlement of the grain boundaries and hence a reduction in the fatigue strength of the plain bearing material.

In principle, it is possible to reduce the high diffusion mobility of the zinc in the aluminum alloy by adding magnesium to the alloy because the magnesium combines with zinc to form the M phase (MgZn2) and the T phase (Al2Mg2Zn3). As mentioned, however, the unwanted Mg3Bi2 phase is formed in alloys that contain bismuth.

The problem with the monotectic aluminum-bismuth microstructure applies more generally to monotectic microstructures in which droplets of a primary phase are distributed in a matrix that crystallizes out, wherein fine and as far as possible uniform distribution is desirable in order to achieve favorable properties, e.g. tribological properties.

It is therefore the underlying object of the present invention to enable uniform distribution of the droplets of the primary phase in the matrix that crystallizes out, using simple means during the production of the monotectic alloy itself.

According to the invention, this object is achieved in a method of the type mentioned at the outset having the following method steps:
a) melting the alloy constituents, which consist of at least one matrix component and a component that forms the primary phase, and heating the constituents to a temperature at which a single homogeneous phase exists;
b) transferring the melt in strand form at a transfer speed in a transfer unit that slopes with respect to the horizontal;
c) cooling the melt from a lower side of the strand, which is perpendicular to the transfer direction, during transfer in order to form a crystallization front during transfer in a cooling zone;
d) matching the cooling intensity, the slope of the transfer direction and the transfer speed in such a way that a horizontal crystallization front is formed and that the Marangoni force produced by the cooling and formation of the primary phase in the form of droplets is oriented anti-parallel to the gravitational force, with the result that the droplets of the primary phase in the matrix component move in the direction of the gravitational force;
e) withdrawing the alloy, which has solidified into the strand, from the cooling zone.

The abovementioned object is furthermore achieved by means of a device of the type stated at the outset which is characterized by the following features:
i. A transfer unit is used to transfer the melt in strand form, which has been heated to form a single homogeneous phase, through a cooling zone at a transfer speed;
ii. The transfer unit has a slope relative to the horizontal in the region of the cooling zone;
iii. In the cooling zone, a cooling unit brings about cooling of the melt from the lower side of the strand;
iv. A cooling intensity of the cooling unit and the slope and transfer speed of the transfer unit are matched to one another in such a way that a horizontal crystallization front is formed and the Marangoni force produced by the cooling and formation of a primary phase is oriented anti-parallel to the gravitational force, with the result that the droplets of the primary phase move in the direction of the gravitational force during cooling;
v. A withdrawal unit withdraws the solidified strand from the cooling zone.

The cooling intensity used according to the invention is dependent on the slope of the transfer direction and on the transfer speed but should preferably have a cooling rate of the cooling unit of between 1 and 1000 K/s, preferably between 200 and 600 K/s.

At least one grain refiner is preferably added to the alloy. The amount of grain refiner added can at least be reduced if a master alloy containing seed crystals is added to the melt.

The invention is preferably used to produce a plain bearing alloy which is, in particular, an aluminum-bismuth alloy. This alloy can contain up to 3% by weight of Al—Ti—B or Al—Ti—C as a grain refiner.

It has proven worthwhile to set the slope of the transfer direction during the cooling of the melt relative to the horizontal to 1 to 60°, preferably to 10 to 30°. In particular, the slope in the region of the cooling zone can be designed as a circular arc segment, which preferably extends over a quarter circle.

The present invention is based on the following insights and circumstances, which are explained by means of the figures of the drawing, of which:

Figure 1:
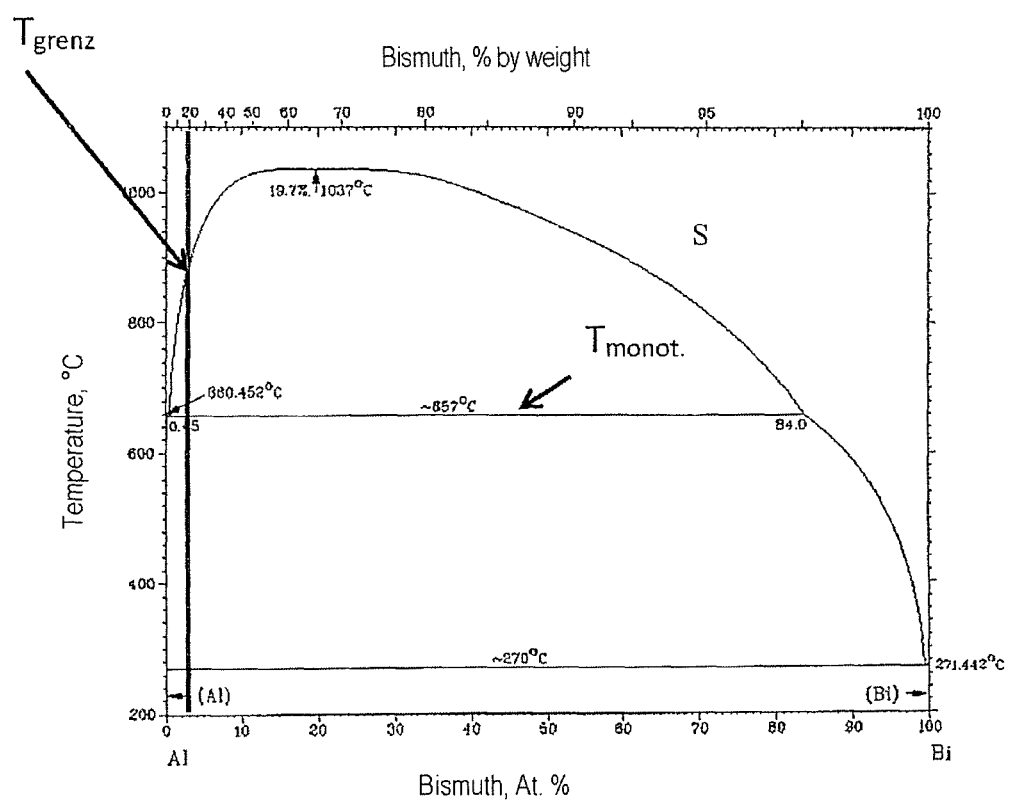
FIG. 1 shows a state diagram for an aluminum-bismuth alloy.

Monotectic systems are characterized by the fact that they have a miscibility gap in the molten state. The reason for segregation in the molten state is primarily the very large differences in atomic radii and differences in atomic weight, which cause disruption to the structural and bonding conditions, even in the molten state. The miscibility gap is characterized by a limiting temperature $T_{grenz}$, which is plotted at about 880° C. for an aluminum-bismuth alloy in the state diagram attached as FIG. 1. Above this limiting temperature $T_{grenz}$, i.e. above the miscibility gap, monotectic alloys are single-phase, that is to say consist of just a single melt. Below the limiting temperature $T_{grenz}$, a primary phase consisting of primary bismuth forms from the homogeneous melt as it cools. Here, the aluminum matrix is still in the molten form. The still-molten matrix contains a low proportion of bismuth in dissolved form. When the temperature $T_{mt}$ for monotectic conversion is reached at 657° C., there are still 0.45 at. % of bismuth in the still completely molten aluminum matrix. Below the temperature $T_{mt}$, the matrix gradually solidifies to form pure aluminum, with bismuth becoming enriched in the decreasing liquid until the composition is Al+84 at. % of bismuth. This liquid converts to pure aluminum and pure bismuth at a temperature of 270° C. This bismuth is a secondary bismuth since it has formed from a secondary phase.

The melt can have further secondary phases, e.g. CuAl2, Al12Mn, Al6Mn, Al3Zr and the monotectic (secondary) bismuth already mentioned.

As the primary phase precipitates from the melt, the differences in density between aluminum ($\rho$=2.7 g/cm$^2$) and bismuth ($\rho$=9.78 g/cm$^2$) begin to take effect. The melt components also have a significant difference in density, resulting in gravitational segregation. The bismuth-rich melt of higher specific weight will sink to the bottom of the melting vessel, while the lighter aluminum-rich melt will rise above it.

In addition, the process of growth of the precipitated droplets of the primary phase will be affected by the mobility thereof in the molten matrix. The primary phase droplets which precipitate as the segregation temperature is undershot move in the temperature field of the sample owing to the temperature dependence of the interface tension. This "Marangoni motion" takes place in the direction of the highest temperature counter to the steepest temperature gradient. Since the speed of the Marangoni motion is proportional to the size of the droplets, the larger droplets can move faster than the smaller droplets and may absorb the smaller droplets to form even larger droplets. The Marangoni drifting speed is proportional to the radius as well as to the temperature and concentration gradients. The droplets of the primary phase are additionally acted upon by the force of gravity, resulting in a movement of the droplets of the primary phase in the molten matrix which is the result of a vectorial addition of the force of gravity Fg and of the Marangoni force Fm. This is illustrated for conventional casting methods by means of FIGS. 2 to 4.

Figure 2:
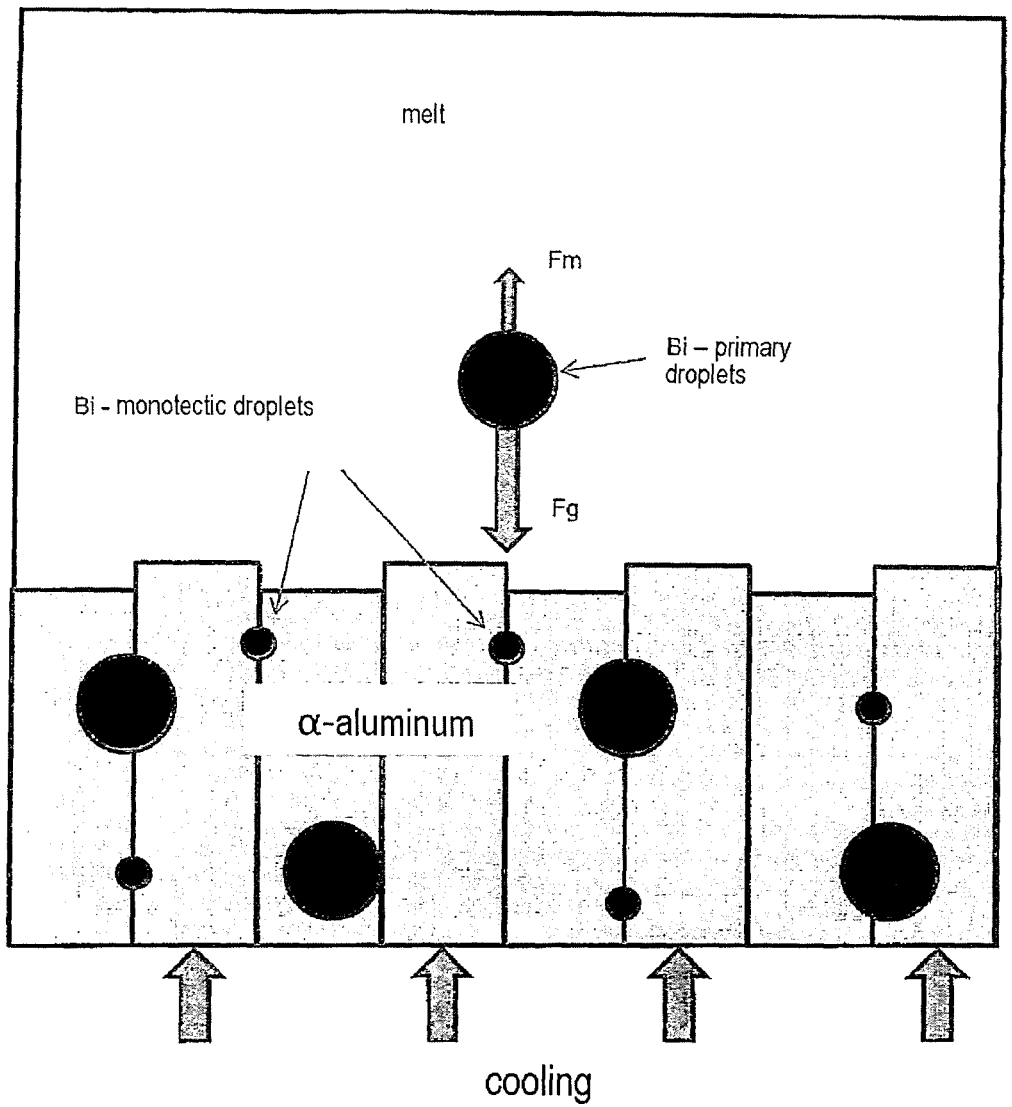
FIG. 2 shows a schematic illustration of the cooling process for an ingot casting method with cooling from the lower side.

FIG. 2 relates to an immobile melt, i.e. an ingot casting method. Cooling takes place from the lower side of a melting vessel, with the result that a horizontal crystallization front of the matrix, which is formed by aluminum in the example illustrated, moves upward. The force of gravity acts downward and the Marangoni force upward on the precipitated droplets of the primary phase, which is formed by bismuth (Bi) in the example. Since the force of gravity is greater than the Marangoni force, there is a vertical resultant force, which is perpendicular to the crystallization front and forces the droplets toward the crystallization front (solidification front). The droplets, which are in this case composed of bismuth, are forced toward the solidification front by the resultant force acting in the direction of the force of gravity Fg and therefore remain uniformly distributed in the aluminum matrix.

Figure 3:
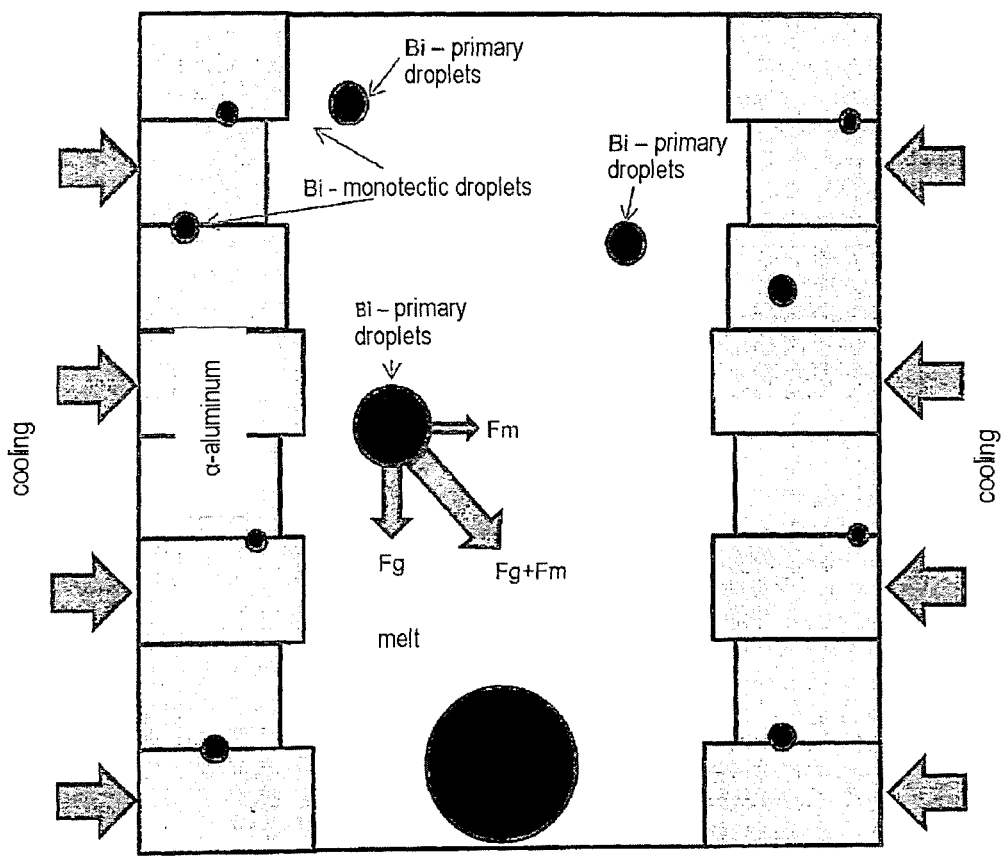
FIG. 3 shows a schematic illustration of the cooling behavior in an ingot casting method with cooling from the side walls.

The example, illustrated in FIG. 3, of a conventional casting method is likewise an ingot casting method, in which the melt is not moved. In contrast to the example shown in FIG. 2, however, cooling does not take place via a bottom surface but via perpendicular side faces of the casting vessel, with the result that the crystallization front moves inward from the side faces, as illustrated in the drawing by the schematically illustrated front segments. The force of gravity Fg acts in a vertical direction on the droplets of the primary phase, while, in this case, the Marangoni force Fm is horizontal. The resultant force Fg+Fm is directed obliquely downward, with the result that the droplets are not forced toward the solidification front by the force of gravity but move substantially toward the bottom of the casting vessel. The bismuth droplets are therefore not distributed uniformly and segregations occur. Since the movement of the droplets is substantially toward the bottom of the casting vessel, the droplets also have a long dwell time in the melt, which does not solidify from the bottom but from the side walls. This results in an enlargement of the droplets when they combine with smaller (and slower) droplets.

Figure 4:
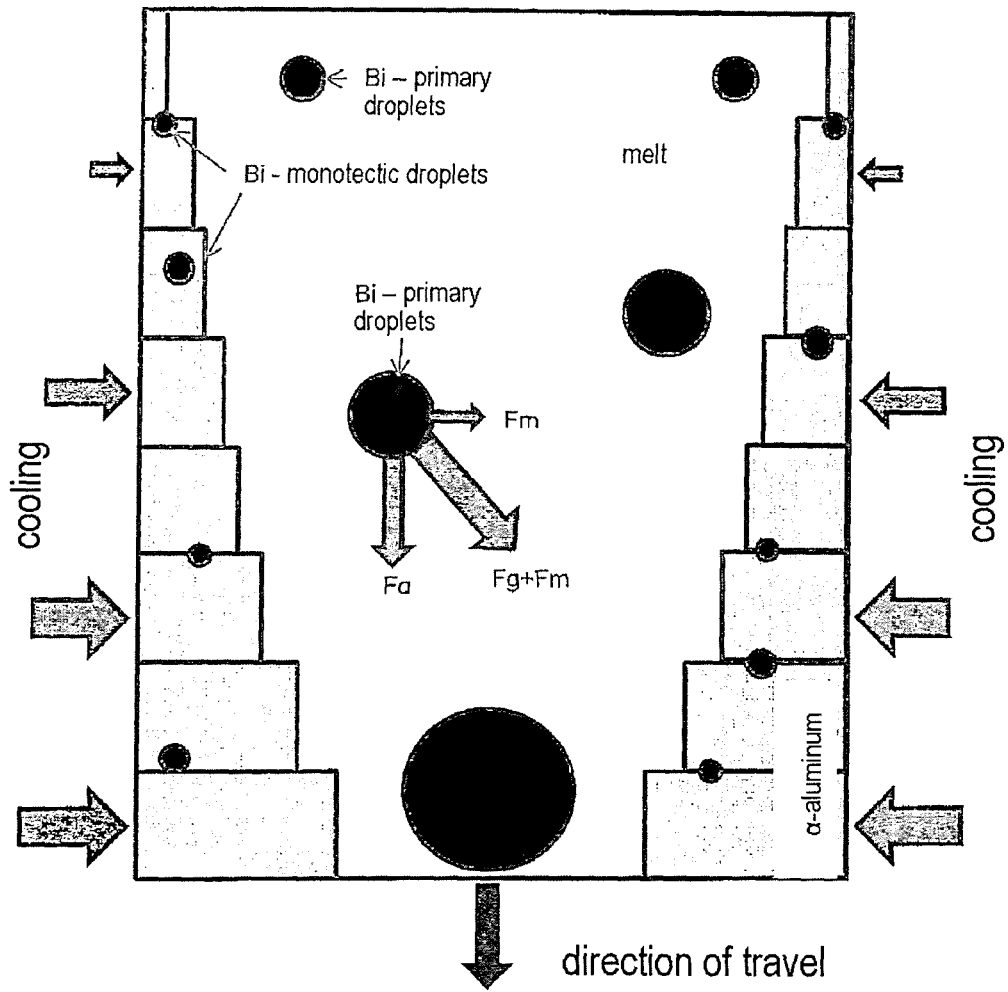
FIG. 4 shows a schematic illustration of the cooling behavior in a conventional continuous casting method with transfer of the melt in a vertical direction.

FIG. 4 shows schematically the conditions for a continuous casting method, in which the melt moves in the direction of the force of gravity, i.e. vertically downward. In this case, cooling takes place from the sides of the strand, i.e. perpendicularly to the direction of travel of the alloy. Here too, the Marangoni force Fm is perpendicular to the force of gravity Fg, resulting in a movement of the droplets of the primary phase which is substantially not directed toward the advancing solidification front. Accordingly, segregations and enlarged droplets, i.e. not fine distribution of the primary phase in the solidified matrix, occurs here too.

Figure 5:
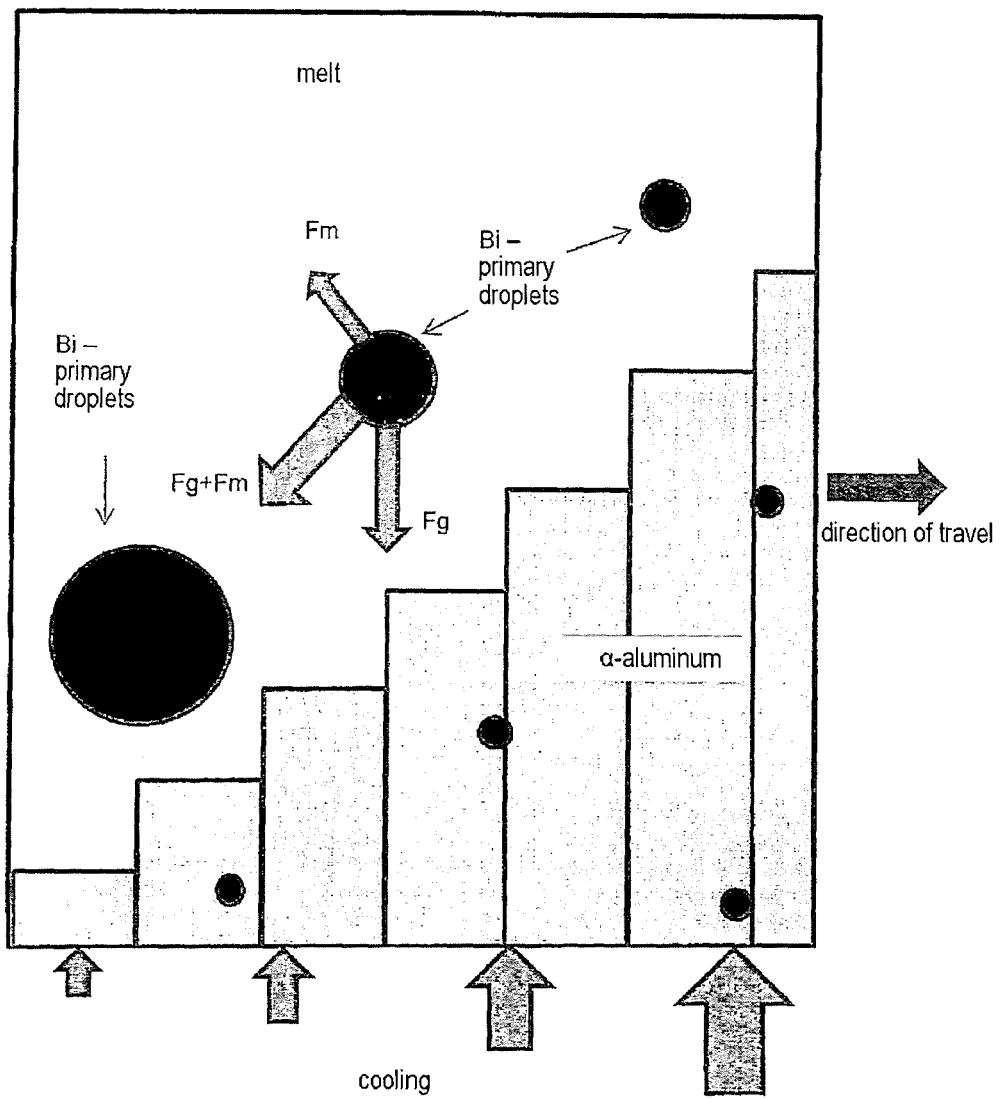
FIG. 5 shows a schematic illustration of the cooling behavior for a continuous casting method with horizontal transfer of the melt.

A similar pattern is shown in FIG. 5 for the case of a continuous casting method, in which cooling takes place from the lower side counter to the force of gravity. In this case, the Marangoni force is aligned in the direction of the greatest temperature gradient and is directed obliquely upward, away from the solidification front, which increases in size in the direction of travel. The direction of movement of the droplets of the primary phase is thus toward the region of the as yet unsolidified melt, with the result that the dwell time of the droplets of the primary phase in the melt is long.

As a consequence, segregations and large droplets, which are inconsistent with fine distribution, are formed here too.

Figure 6:
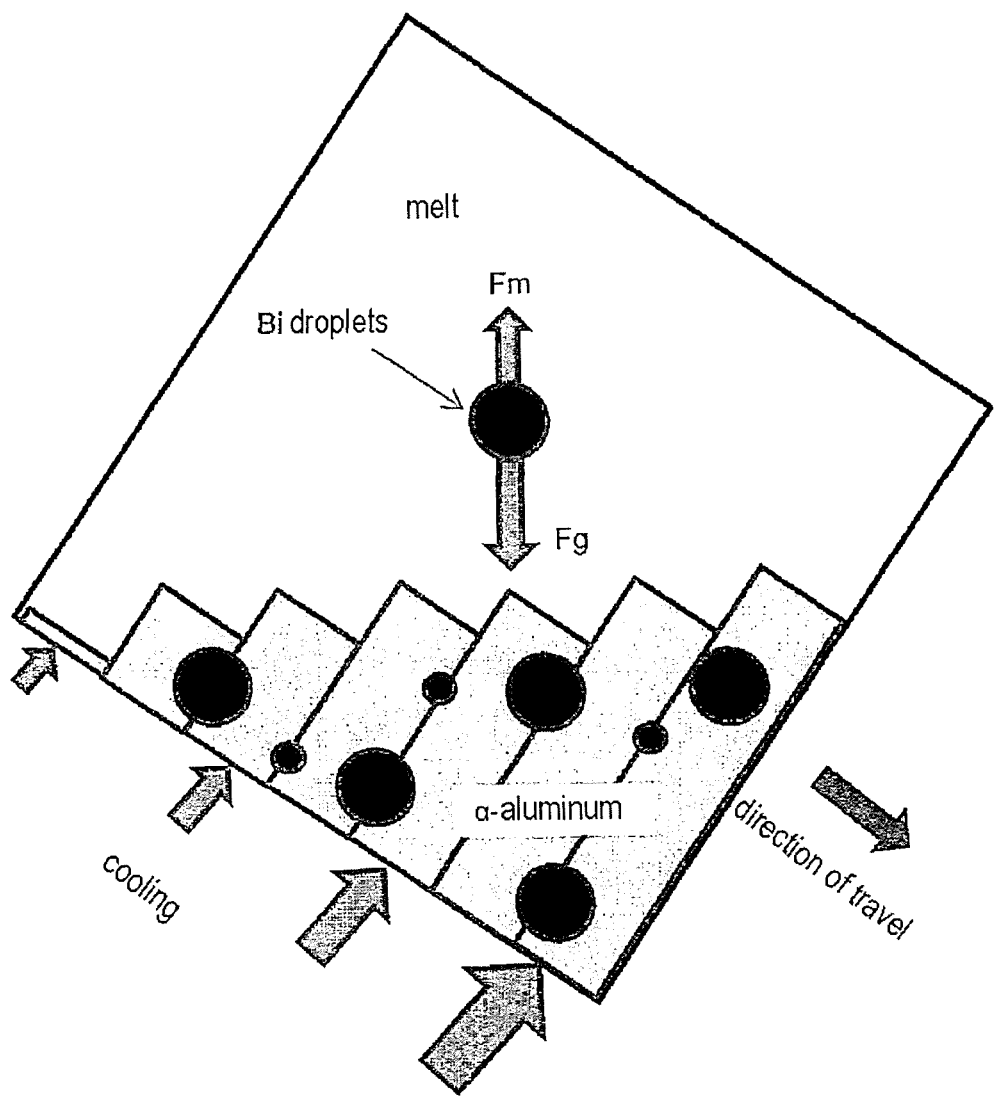
FIG. 6 shows a schematic illustration of the cooling behavior in a continuous casting method according to the invention.

The method according to the invention is illustrated schematically in FIG. 6. It is a continuous casting method, in which the melt is moved in the form of a strand at a slope angle relative to the force of gravity. Cooling takes place perpendicularly to the direction of movement of the melt. The matrix solidification front which forms increases as the distance of travel increases. Here, the cooling and transfer of the melt are matched to one another in such a way that a substantially horizontal crystallization front forms over the distance of travel. Since the greatest temperature gradient forms in a direction away from the (horizontal) crystallization front, the Marangoni force Fm points away from the horizontal crystallization front, i.e. away from the vertical. In contrast, the force of gravity is vertical and is greater than the Marangoni force, with the result that the droplets of the primary phase (here: bismuth) are forced toward the substantially horizontally forming crystallization front by a resultant force in the direction of the force of gravity Fg. The droplets of the primary phase are therefore absorbed by the crystallizing matrix with a minimum dwell time in the molten melt and therefore remain finely distributed in the matrix (here: aluminum matrix). By means of the measure according to the invention, i.e. transferring the melt at a slope angle relative to the horizontal and cooling it from the lower side of the strand, it is therefore possible to achieve fine and homogeneous distribution of the droplets of the primary phase in the crystallized matrix, that is to say, for example, to obtain a finely distributed aluminum-bismuth alloy, by means of the continuous casting device itself.

As an essential point of the invention, it should be noted that the transfer path of the strand form of the melt does not have to be rectilinear, that is to say that the slope does not have to be constant. On the contrary, it may be worthwhile to make the slope increase over the transfer path in order in this way to take account of the accelerating progress of the solidification front.

By the very nature of the subject matter, there is no need for compliance with mathematically correct geometrical relationships where the terms "horizontally", "vertically" and "perpendicularly to one another" are used in the above explanations. On the contrary, these terms should be understood as indications with tolerances, the permissible size of which a person skilled in the art can readily determine to achieve the success according to the invention of a segregation-free microstructure for the monotectic alloy. In particular, segregations are avoided to a noticeable extent even when the crystallization front that forms encloses a small angle of, for example, ±30 degrees with the horizontal.

The transfer rate of the transfer unit for the melt in strand form does not need to be constant either but can vary over the transfer path. It is furthermore possible not to withdraw the strand continuously after solidification but to operate intermittently in order in this way to allow cooling after the solidification of the microstructure in a defined form or even to allow a subsequent heat treatment.

Figure 7:
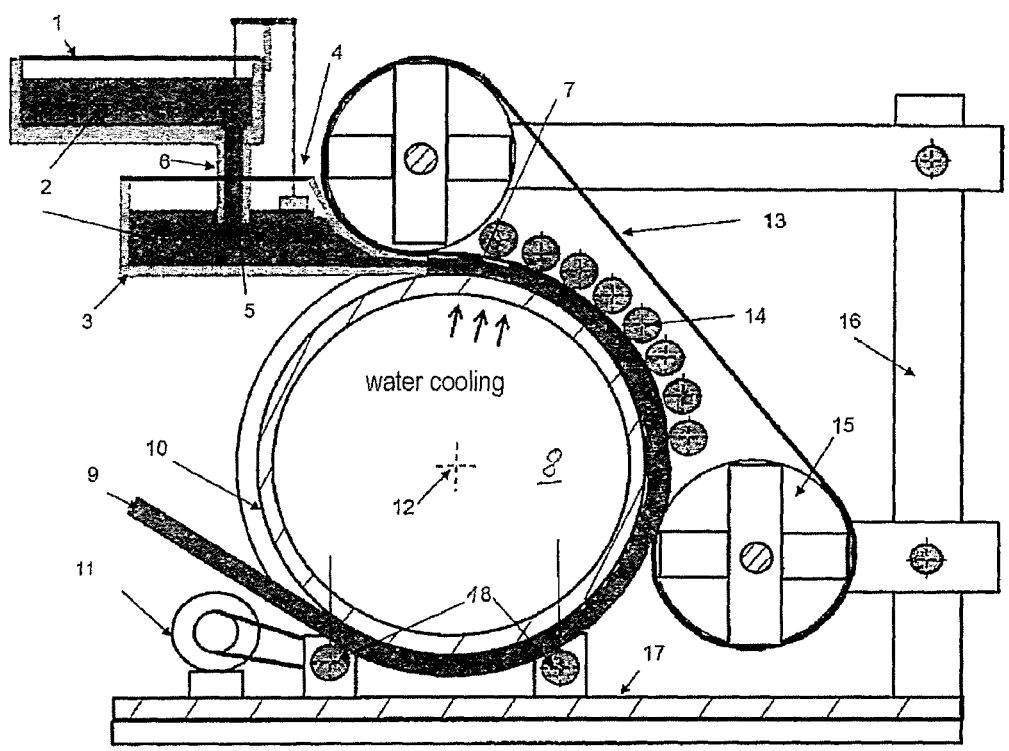
FIG. 7 shows an illustrative embodiment of a device for carrying out the continuous casting method according to the invention.

An illustrative embodiment of a device according to the invention is illustrated in FIG. 7.

A melt 2 of the alloy flows out of a reservoir 1 into a metering vessel 3 arranged underneath, in which the melt 2 is held at a predetermined level. For this purpose, use is made of a float 4 on the melt 2 in the metering vessel 3, which is connected to a closing valve 5 in an inlet 6 from the reservoir 1 into the metering vessel 3. The metering vessel 3 has a rectangular outlet 7, from which the melt emerges in the form of a rectangular strand in a viscous form. The outlet 7 emerges at the highest point of a hollow roll 8, on the circumferential surface of which the strand emerging from the metering vessel 3 is guided. The hollow roll 8 has a water-cooled shell 10, which can be composed of copper for example. Owing to the cooling, the melt emerging from the outlet 7 solidifies rapidly in the manner described according to the invention to give the strand 9, which is guided over somewhat more than half the circumference of the hollow roll on the circumferential surface and is then withdrawn. For this purpose, the hollow roll 8 is set in rotation about its central axis 12 via bearing rollers 18 by means of a geared motor 11, with the result that the melt or strand 9 does not have to perform any movement relative to the circumferential surface of the hollow roll 8. On the first quadrant of the circumferential surface, the melt 9 or the solidifying strand is guided on the upper side of the circumferential surface by one section of an endlessly circulating steel belt 13. This section of the steel belt 13 is pressed with a defined pressure against the circumferential surface of the hollow roll 8 by means of a multiplicity of contact pressure rollers 14, with the result that a shaping and conveying force is exerted on the strand 9 via the steel belt 13. The steel belt 13 is driven by means of a drive roller 15 at a speed such that the section of the steel belt 13 is moved without a relative speed with respect to the circumferential surface of the hollow roll 8.

The entire device is situated on a supporting stand 16, which is secured rigidly on a foundation 17.

The illustration in FIG. 7 is made schematic for reasons of clarity. Details such as the water cooling of the shell 10, the drive and the regulation of the speed of the steel belt 13 are known to a person skilled in the art and are not illustrated for reasons of clarity.

EXAMPLE 1

Figure 8:
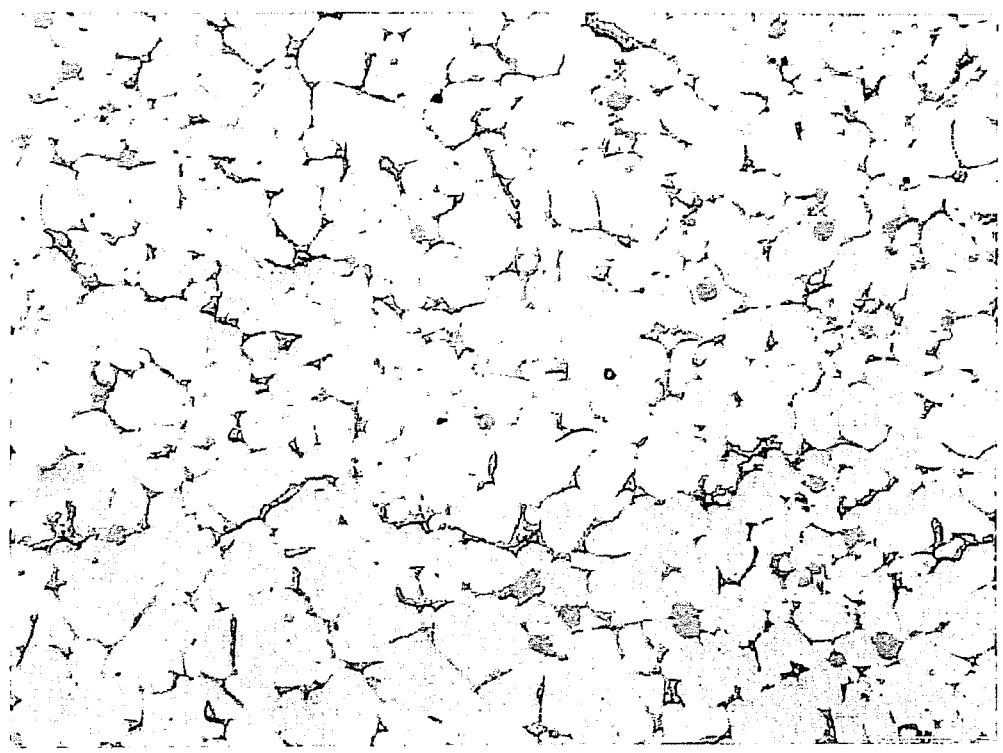
FIG. 8 shows a micrograph of a cast microstructure of a first preferred plain bearing alloy.

FIG. 8 shows the cast microstructure of an AlCu4Bi6TiZrMn plain bearing alloy embodied as a preferred illustrative embodiment. The bismuth phase shown in dark gray is in the form of droplets. The droplets have a diameter of no more than about 10 μm. The cast microstructure in FIG. 8 was produced with the device shown in FIG. 7. During this process, the strand 9 was withdrawn with a cross section of 10 mm×220 mm. For the production of a plain bearing, the strand 9 was then brushed. A degreased adhesion promoter composed of an aluminum alloy was roll-bonded onto the brushed and degreased strand by means of a first rolling pass in a roll stand. The thickness of the roll-bonded feedstock strip was 4 mm. This was then rolled down to 1.3 mm in five rolling passes. In order to improve the suitability of the strip of aluminum bearing material for roll bonding, it was subjected to a recovery annealing operation at 370° C. lasting for up to 3 hours. In the next processing step, a steel strip as the backing material for the plain bearing and the strip of aluminum bearing material were joined together in a roll-bonding mill. The material bond produced was then subjected to heat treatment for three hours at a temperature of 360° C., wherein the bond between the steel and the aluminum bearing material was enhanced by a diffusion process and the bismuth strands, which were greatly extended in the aluminum-copper matrix of the plain bearing alloy after the roll bonding operation, were fully converted to fine spherical droplets with a size of up to 25 μm. The preliminary heat treatment resulted in a high hardness of over 42 HB 2.5/62.5/30. After the heat treatment, the roll-bonded strip can be subdivided and shaped into plain bearing shells.

EXAMPLE 2

According to another preferred embodiment, to produce the plain bearing material, cast strips with a cross section of 10 mm×220 mm are produced on a continuous casting installation shown in FIG. 7. 5 minutes before casting, a 1% AlTi3C0.15 master alloy is fed to the AlCu4Bi6TiMnCr alloy in the crucible (metering vessel 3), and the melt is thoroughly mixed. The strand produced and cooled in accordance with the invention is brushed and degreased. A brushed and degreased adhesion promoter composed of an aluminum alloy is roll-bonded onto the strand by means of a first rolling pass. The thickness of the roll-bonded feedstock strip is 4 mm. This is then rolled down to 1.3 mm in several rolling passes. For this purpose, five rolling passes are required. In order to improve the suitability of the strip of aluminum bearing material for roll bonding, it is subjected to a recovery annealing operation at 370° C. lasting for up to 3 hours. In the next processing step, a steel strip and the strip of aluminum bearing material are joined together in a roll-bonding mill.

The material bond produced is then subjected to heat treatment for three hours at a temperature of 360° C., wherein the bond between the steel and the aluminum bearing material is enhanced by a diffusion process and the bismuth strands, which are greatly extended in the aluminum-copper matrix after the roll bonding operation, are fully converted to fine spherical droplets with a size of up to 32 µm. The high hardness of at least 38 HB 2.5/62.5/30 likewise resulting from the heat treatment has an advantageous effect. After this heat treatment, the roll-bonded strip can be subdivided and shaped into bearing shells.

Figure 9:
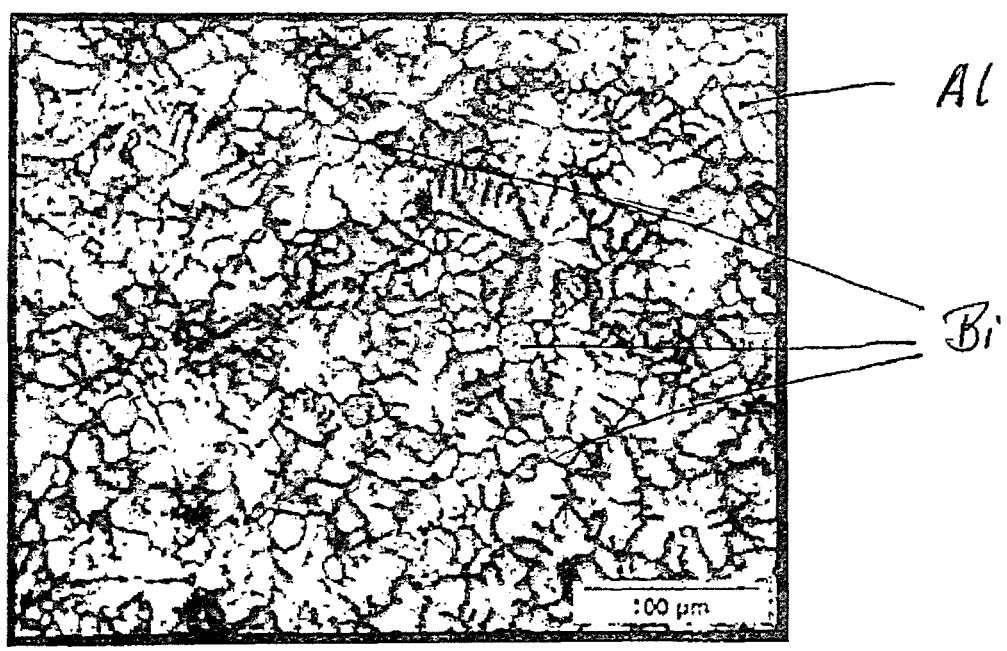
FIG. 9 shows a micrograph of a cast microstructure of a second preferred plain bearing alloy.

FIG. 9 shows the microstructure of the alloy after production by casting. The droplet-shaped primary bismuth phase, which is embedded in a uniformly distributed manner in the aluminum matrix, is clearly visible. Surprisingly, the use of the master alloy according to this example means that it is possible to dispense with zirconium as a grain refiner.

The description of the production of the plain bearing with the plain bearing alloy according to the invention is given purely by way of example since the production steps for a plain bearing with an alloy formed by continuous casting are known to a person skilled in the art, and all the possible variants that can be employed in using the alloy according to the invention are familiar to said person.

The invention claimed is:

1. A method for producing a strand from a monotectic alloy which is formed from a plurality of constituents and in which droplets of a primary phase are uniformly distributed in a crystalline matrix in a solidified state, comprising the following steps:
    a) melting the plurality of constituents, wherein the plurality of constituents include at least one matrix component and a component that forms a primary phase, and wherein melting is performed by heating the plurality of constituents to a temperature at which a single homogeneous phase melt exists;
    b) transferring the melt in a form of a strand at a transfer speed in a transfer unit that slopes with respect to horizontal;
    c) cooling the melt from a lower side of the strand, wherein the lower side of the strand is perpendicular to a transfer direction, wherein cooling is performed during transferring in order to form a horizontal crystallization front during transfer in a cooling zone;
    d) matching a cooling intensity, the slope of the transfer direction and the transfer speed in such a way that the horizontal crystallization front is formed and that a Marangoni force produced by the cooling and formation of the primary phase in the form of droplets is oriented anti-parallel to a gravitational force, with a result that droplets of the primary phase in the matrix component move in the direction of the gravitational force; and
    e) withdrawing the monotectic alloy, which has solidified as a strand, from the cooling zone.

2. The method as claimed in claim 1, wherein a cooling rate provided by a cooling unit for the step of cooling is set to between 1 and 1000 K/s.

3. The method of claim 2 wherein the cooling rate is between 200 and 600 K/s.

4. The method as claimed in claim 1 further comprising the step of adding to the melt a master alloy containing seed crystals.

5. The method as claimed in claim 1 wherein the monotectic alloy is a plain bearing alloy.

6. The method as claimed in claim 5, wherein the plain bearing alloy is an aluminum-bismuth alloy.

7. The method as claimed in claim 6, wherein the aluminum-bismuth alloy contains up to 3% by weight of Al—Ti—B or Al—Ti—C as a grain refiner.

8. The method as claimed in claim 1 wherein the slope of the transfer direction during the cooling of the melt relative to horizontal is set to 1 to 60°.

9. The method of claim 8 wherein the slope of the transfer direction during the cooling is from 10 to 30°.

* * * * *